United States Patent
Wang et al.

[11] Patent Number: 5,966,610
[45] Date of Patent: Oct. 12, 1999

[54] METHOD OF FABRICATING CAPACITOR PLATE

[75] Inventors: Shiou-Yu Wang, Taipei; Tean-Sen Jen, Chiayih; Jia-Shyong Cheng, Hsinchu Hsien, all of Taiwan

[73] Assignee: Nan Ya Technology Corp., Taiwan

[21] Appl. No.: 09/002,675

[22] Filed: Jan. 5, 1998

[30] Foreign Application Priority Data

Jul. 23, 1997 [TW] Taiwan ................................ 86110489

[51] Int. Cl.⁶ .................................................. H01L 21/20
[52] U.S. Cl. .......................................... 438/396; 438/253
[58] Field of Search ..................................... 438/396, 398, 438/255, 253

[56] References Cited

U.S. PATENT DOCUMENTS

| | | | |
|---|---|---|---|
| 5,389,568 | 2/1995 | Yun | 437/60 |
| 5,554,557 | 9/1996 | Koh | 438/398 |
| 5,693,554 | 12/1997 | Lee | 438/398 |
| 5,792,689 | 8/1998 | Yang et al. | 438/255 |

Primary Examiner—Tuan H. Nguyen
Attorney, Agent, or Firm—Michael D. Bednarek; Crowell & Moring LLP

[57] ABSTRACT

A method of fabricating a capacitor plate constitutes first providing a substrate. Then, first insulating layer is formed over the substrate. Sequentially, a buffering layer and a second insulating layer, both of which constitute a stacked structure, are formed over the first insulating layer. Next, the stacked structure is patterned into an opening thereby exposing a portion of the first insulating layer therethrough. Subsequently, conducting spacers are formed on the sidewalls of the opening. The second insulating layer is thereafter removed, and simultaneously a portion of the first insulating layer not covered by the buffering layer and the conducting spacers are removed to form a contact window, thereby exposing a portion of the substrate therethrough. Then, a conducting layer is conformably deposited over the substrate, and thereafter etched away until a portion of the buffering layer is exposed. Finally, the exposed buffering layer is removed. The remaining conducting layer and the conducting spacers constitute the capacitor's bottom electrode plate.

17 Claims, 7 Drawing Sheets

METHOD OF FABRICATING CAPACITOR PLATE

BACKGROUND OF THE INVENTION

1. Field of the Invention

The present invention generally relates to a method of fabricating capacitor plates applied to semiconductor devices. More particularly, the present invention relates to a method of fabricating stacked capacitors for application in dynamic random access memory devices.

2. Description of the Prior Art

High-performance capacitors are key elements for analog CMOS and BiCMOS technology, especially in the areas of A/D converters, D/A converters, oscillators, time-delay circuitry, and switched-capacitor filters. Moreover, capacitors are also important components for digital circuits, such as dynamic random-access-memory (DRAM) devices.

Essentially, a capacitor has two conducting plates (electrodes) spaced by an insulator. As well known by those persons skilled in this field, the most important parameters involved in affecting the charge stored on the capacitor are the dielectric constant and thickness of the insulator, and the area of the capacitor plates. However, as the DRAM cell has been scaled down in size, the minimum amount of stored charge needed to maintain reliable memory operation has remained the same. Therefore, a new technology is necessary allow the DRAM cell to shrink in size without a loss of its storage capacity.

It should be noted that a cell's storage capacity can be increased by making the capacitor dielectric thinner, by using an insulator with larger dielectric constant, or by increasing the area of the capacitor plates. The first two options are not currently feasible, since capacitor dielectrics thinner than those now being used in DRAM cells will suffer leakage due to Fowler-Nordheim tunneling, and insulators with significantly larger dielectric constants than that of silicon oxide have not yet been accepted for DRAM-cell application. The third approach, increasing the area of the capacitor plates, can be effective if the area is increased by forming the storage capacitor in three dimensions.

A stacked capacitor (STC) fabricated on top of the access transistor is one approach to increase the area of the capacitor plates, having features of low soft error rates and the capability of being combined with the application of high dielectric constant insulator.

However, since that the structure of three-dimensional stacked capacitors is quite complicated, the fabrication cost heavily dependent upon the number of masks will be used during photolithography processes. Yun's patent, U.S. Pat. No. 5,389,568, discloses a method of fabricating stacked capacitors, which makes use of two more masks to define bottom capacitor plates as shown in FIGS. 1 and 2.

Referring to FIG. 1, field oxides 101 are formed on a substrate 100 by means of thermal oxidation processes to define an active region therebetween. Transistors are fabricated on the substrate 100 within the active region. Reference numerals 45, 42, 44, 46 represent the source region, gate electrodes, drain region and bit line, respectively. An insulating layer 48 is deposited over the overall surface of the substrate 100 for isolation. A planarizing layer 50 and a conducting layer 52 are sequentially deposited on the insulating layer 48. Another insulating layer 54 is deposited on the conducting layer 52, and then patterned to form an opening just over the drain region 44 by means of a photolithography process.

Next, referring to FIG. 2, sequentially etching the insulating layer 54, the conducting layer 52, the planarizing layer 50, and the insulating layer 48 forms an opening 56 to expose the source regions 45 by means of another photolithography process. Thereafter, a doped polysilicon layer (not shown in FIG. 2) is conformally deposited over the substrate 100, electrically connected to the source regions 45 via the opening 56.

However, the addition of two masks increases the fabrication cost, so there is a need for a method of fabricating capacitor plates that can reduce the number of masks and thereby streamline the fabrication process.

SUMMARY OF THE INVENTION

It is therefore an object of the present invention to provide a method of fabricating capacitor plates applied to semiconductor devices that can reduce the number of masks and thereby streamline the fabrication process.

The present invention achieves the above-indicated object by providing a method of fabricating a capacitor plate, comprising the following steps of:

providing a substrate;

forming a first insulating layer over the substrate;

sequentially forming a buffering layer and a second insulating layer, both of which constitute a stacked structure, over the first insulating layer;

patterning the stacked structure to form an opening thereby exposing a portion of the first insulating layer therethrough;

forming conducting spacers adjacent to the sidewalls of the opening;

removing the second insulating layer, and simultaneously removing a portion of the first insulating layer not covered by the buffering layer as well as the conducting spacers to form a contact window thereby exposing a portion of the substrate therethrough;

conformably forming a conducting layer over the substrate;

etching the conducting layer until a portion of the buffering layer is exposed; and removing the exposed buffering layer.

Moreover, the above-identified object can be achieved by providing a method of fabricating a capacitor plate, comprising the following steps of:

providing a substrate;

forming a first insulating layer over the substrate;

forming a conductively-buffering layer overlying the first insulating layer;

forming a second insulating layer overlying the buffering layer;

patterning the second insulating layer to form an opening thereby exposing a portion of the buffering layer;

forming a first conducting layer, which combines with the buffering layer to constitute a second conducting layer, conformably overlying the substrate;

etching the second conducting layer forming a conducting spacers adjacent to the sidewalls of the opening;

removing the second insulating layer, and simultaneously removing a portion of the first insulating layer not covered by the buffering layer as well as the conducting spacers to form a contact window thereby exposing a portion of the substrate therethrough;

conformably forming a third conducting layer over the substrate;

etching the third conducting layer until a portion of the buffering layer is exposed; and removing the exposed buffering layer.

Furthermore, the present invention can achieve the above-identified object by providing a method of fabricating a capacitor, comprising the following steps of:

providing a substrate having a transistor, comprising at least one diffused region, formed thereon and overlaid by an inter-insulating layer;

forming a first oxide layer over the substrate;

sequentially forming a nitride layer and a second oxide layer, both of which constitute a stacked structure, overlying the first oxide layer;

patterning the stacked structure to form an opening, which exposes a portion of the first oxide layer;

forming a first polysilicon layer conformably overlying the substrate;

etching the first polysilicon layer to polysilicon spacers adjacent to the sidewalls of the opening;

removing the second oxide layer, simultaneously removing a portion of the first oxide layer not covered by the nitride layer as well as the polysilicon spacers to form a contact window, thereby exposing a portion of the diffused region;

conformably forming a second polysilicon layer over the substrate;

etching back the second polysilicon layer until a portion of the nitride layer is exposed;

removing the exposed nitride layer thereby the polysilicon spacers and the second polysilicon layer serve as a bottom plate;

forming a dielectric layer overlying the bottom plate; and forming a third polysilicon layer overlying the dielectric layer as an upper plate.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

FIGS. 3–10 schematically depict in cross-sectional views procedural steps involved in fabricating a capacitor according to one embodiment of the present invention. The capacitor can be applied to DRAM device as a storage capacitor. The following embodiment exemplifies the application of DRAM-cells.

Figure 1:
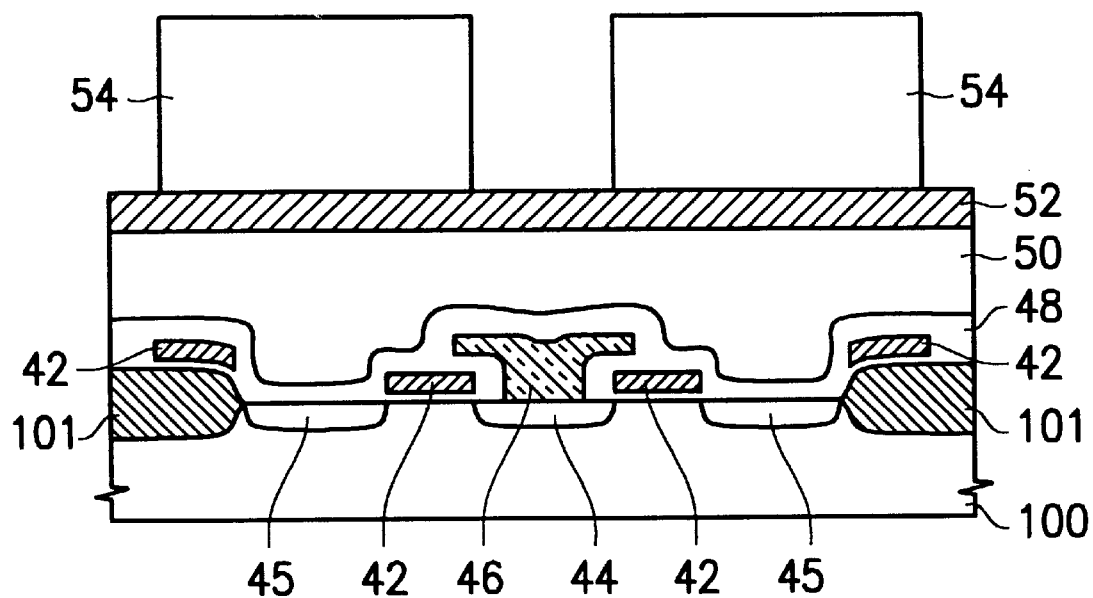
FIGS. 1–2 schematically depict in cross-sectional views procedural steps involved in a conventional method of fabricating stacked capacitor plates.
Figure 2:
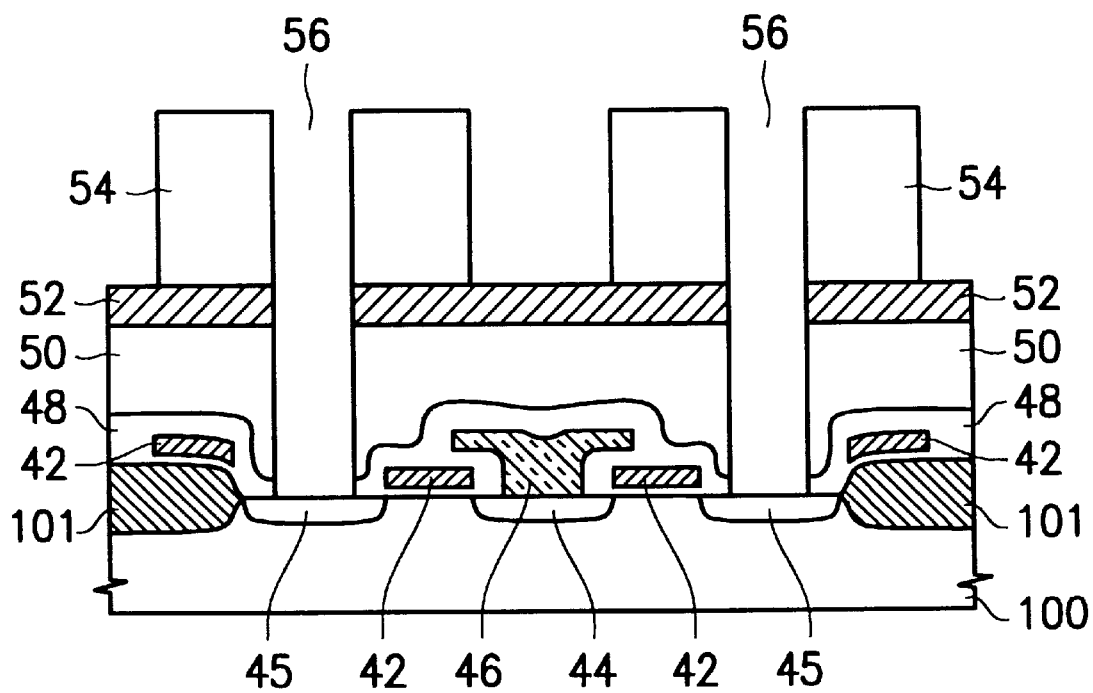
Figure 3:
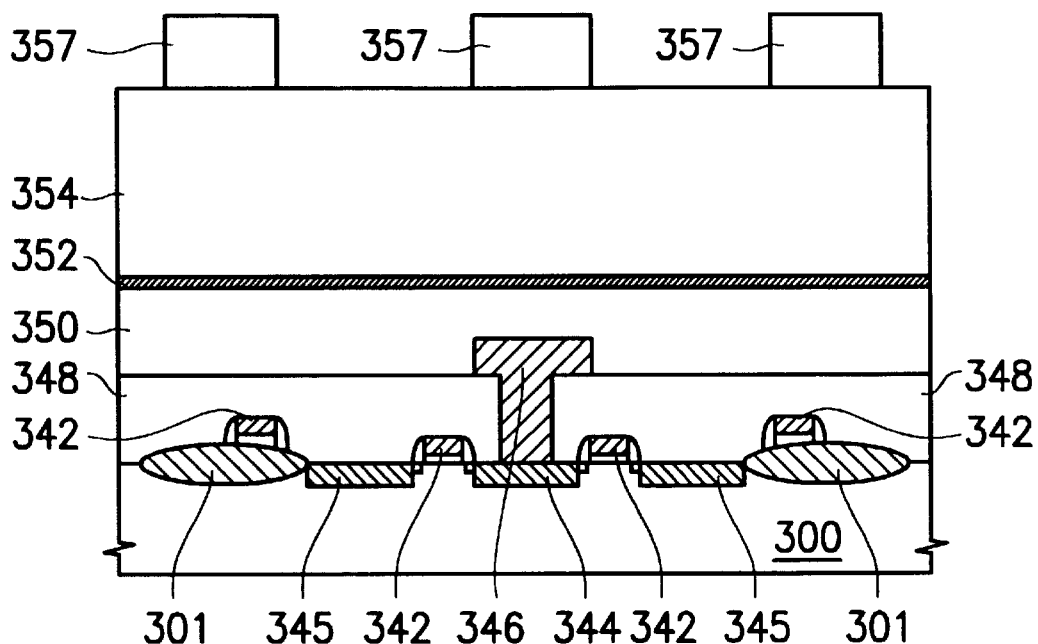
FIGS. 3–10 schematically depict in cross-sectional views procedural steps involved in a method of fabricating a capacitor according to one embodiment of the present invention.

Referring to FIG. 3, a substrate 300 made of semiconductor material, such as silicon, germanium or gallium-arsenide, might be provided by means of epitaxial processes or silicon-on-insulator (SOI) processes. For convenience, a P-type silicon substrate is exemplified.

By thermal oxidation, field insulators 301, having a thickness of about 1500–5000 Å, are formed on the substrate 300 to define an active region therebetween. Transistors are fabricated, by processes of deposition, photolithgraphy, etching, ion implantation, etc., on the substrate 300 within the active region, wherein reference numerals 345 and 344 are diffused source/drain regions that are heavily-doped with N-type impurities. The N$^+$source/drain region 344 is connected to a bit line 346. Gate electrodes 342 represent word lines preferably made of doped polysilicon. Reference numeral 348 represent an inter-insulating layer formed over the substrate 300 for isolation.

Next, an insulating layer 350 is deposited over the substrate 300 and then planarized by means of thermal reflow processes. The insulating layer 350 might be made of silicon dioxide deposited by means of thermal oxidation, or low-pressure chemical vapor deposition (LPCVD) processes by decomposing tetraethyl orthosilicate (TEOS). In addition, the insulating layer 350 can be a borophosphosilicate glass (BPSG) layer, which is deposited by means of atmospheric-pressure chemical vapor deposition processes by the reaction of tetraethyl orthosilicate and $O_3/O_2$, with the addition of tri-ethyl-borate (TEB) and tri-methyl-phosphate (TMP). Preferably, the inter-insulating layer 348 has a thickness of about 500–2000 Å, and the insulating layer 350 has a thickness of about 1500–4000 Å.

Sequentially, a buffering layer 352, an insulating layer 354, both of which constitute a stacked structure, are formed on the insulating layer 350. Preferably, the buffering layer 352 can be formed by the deposition of polysilicon or silicon nitride. For example, if made of silicon nitride, the buffering layer 352 can be formed by means of low-pressure chemical vapor deposition processes by reacting $SiH_2Cl_2$ with $NH_3$ as an etching protection layer for subsequent etching processes. Preferably, the buffering layer has a thickness of about 200–1000 Å. The insulating layer 354 is made of silicon oxide formed by means of low-pressure chemical vapor deposition processes, having a thickness of about 5000–15000 Å, preferably. A photoresist layer 357 is coated over the insulating layer 354 and patterned by means of photolithography.

Figure 4:
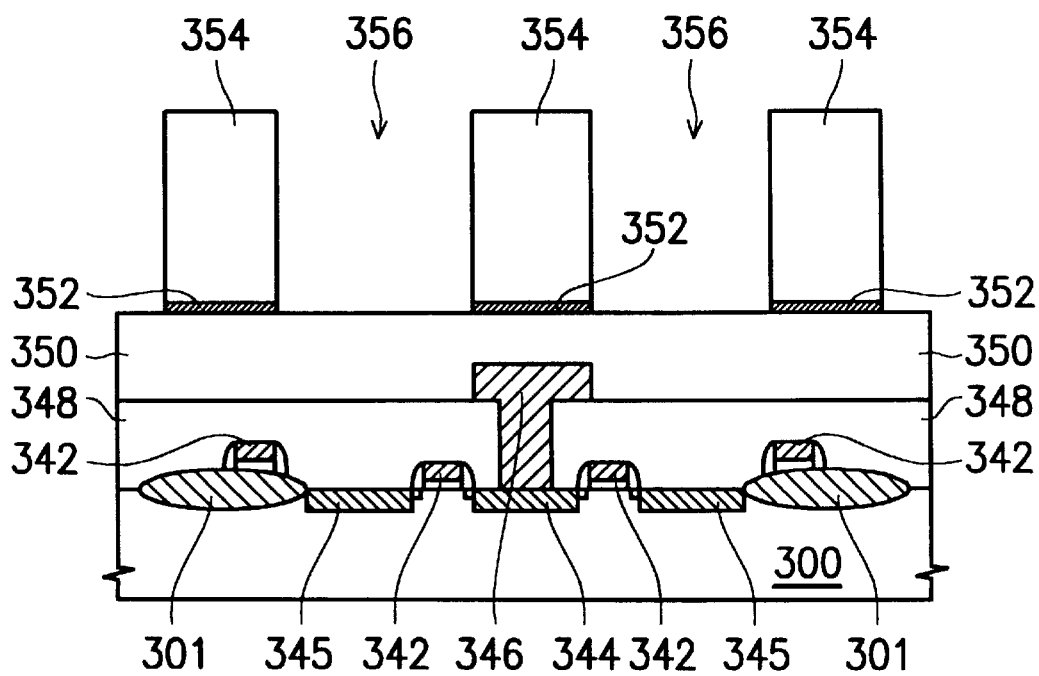

Referring to FIG. 4, by using the patterned photoresist layer 357 as masking, the stacked structure, comprising the insulating layer 354 and the buffering layer 352, forms openings 356 anisotropically etched. Preferably, the etching process is implemented by means of reactive ion etching process making use of $CHF_3$ as reactant to sequentially etch the insulating layer 354 and the buffering layer 352 in order to expose a portion of the insulating layer 350.

Figure 5:
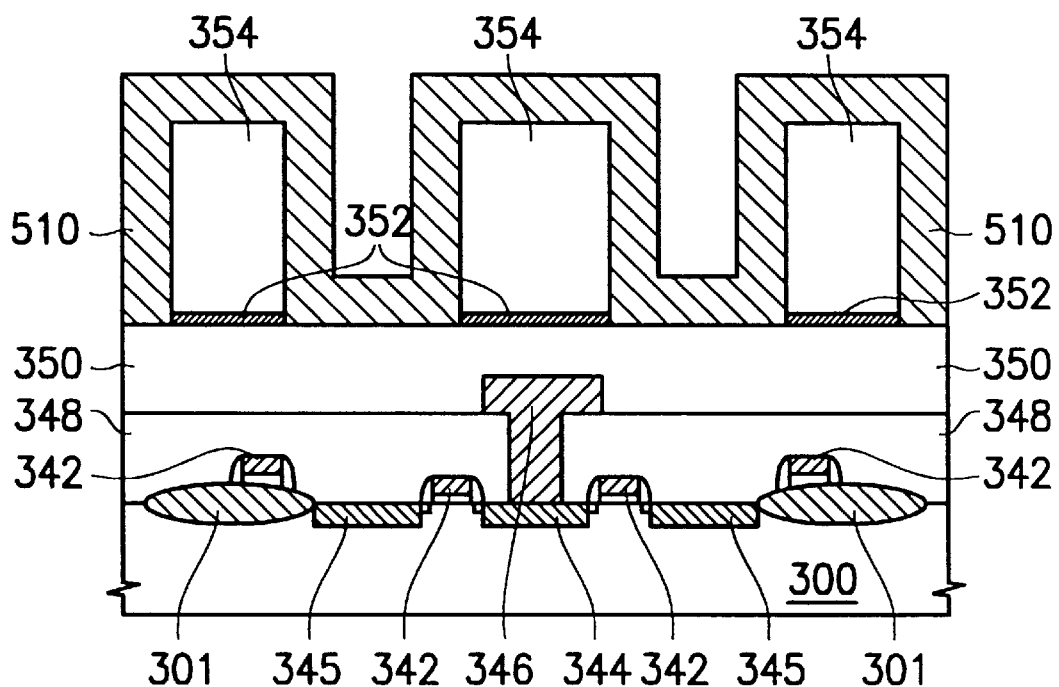

As shown in FIG. 5, a conducting layer 510 is formed over the substrate 300. Preferably, the conducting layer 510 is a polysilicon layer formed by means of a low-pressure chemical vapor deposition process by the pyrolysis of $SiH_4$, having a thickness of about 500–2000 Å so as to conformably overlie overall surface of the stacked structure and the exposed insulating layer 350. To increase the conductivity thereof, the polysilicon can be doped with diffusion, ion implantation, or in-situ doped methods. Preferably, the doping impurities are either arsenic-containing ions or phosphorus-containing ions.

Figure 6:
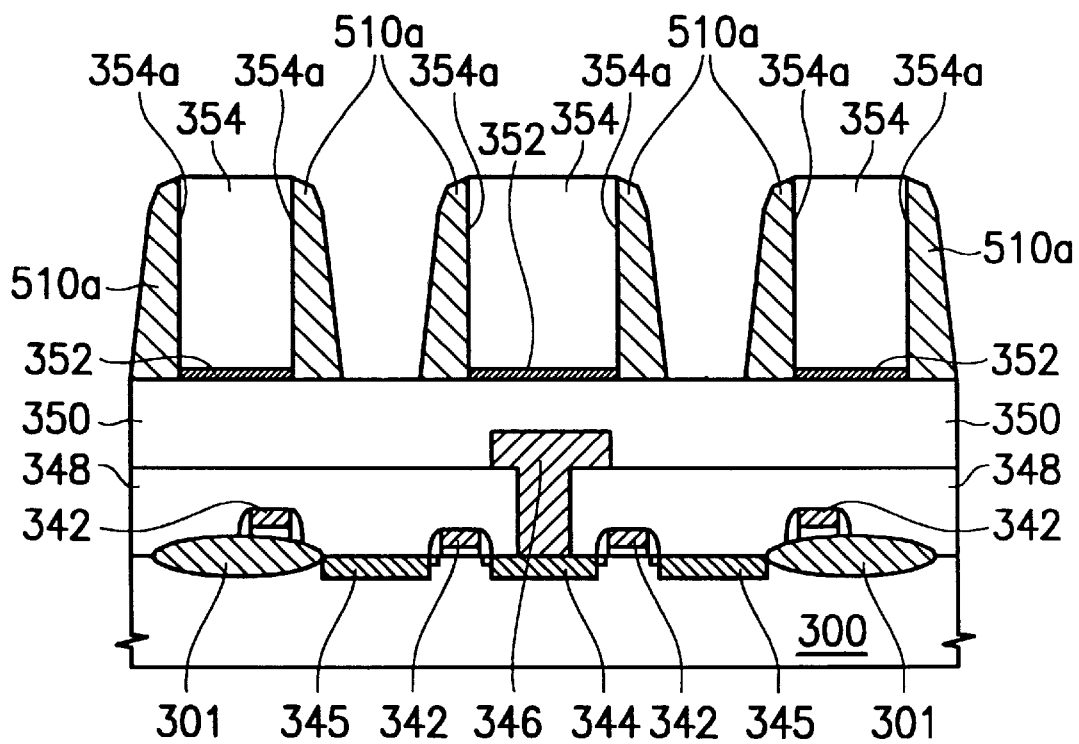

As depicted in FIG. 6, etching back the conducting layer 510 leaves conducting spacers 510a on sidewalls 354a of the openings 356. Preferably, reactive ion etch processes are implemented to etch back the conducting layer by using $Cl_2$, HCl, and SiCl$_2$ as reacting gases if the conducting layer 510 is made of doped polysilicon.

Figure 7:
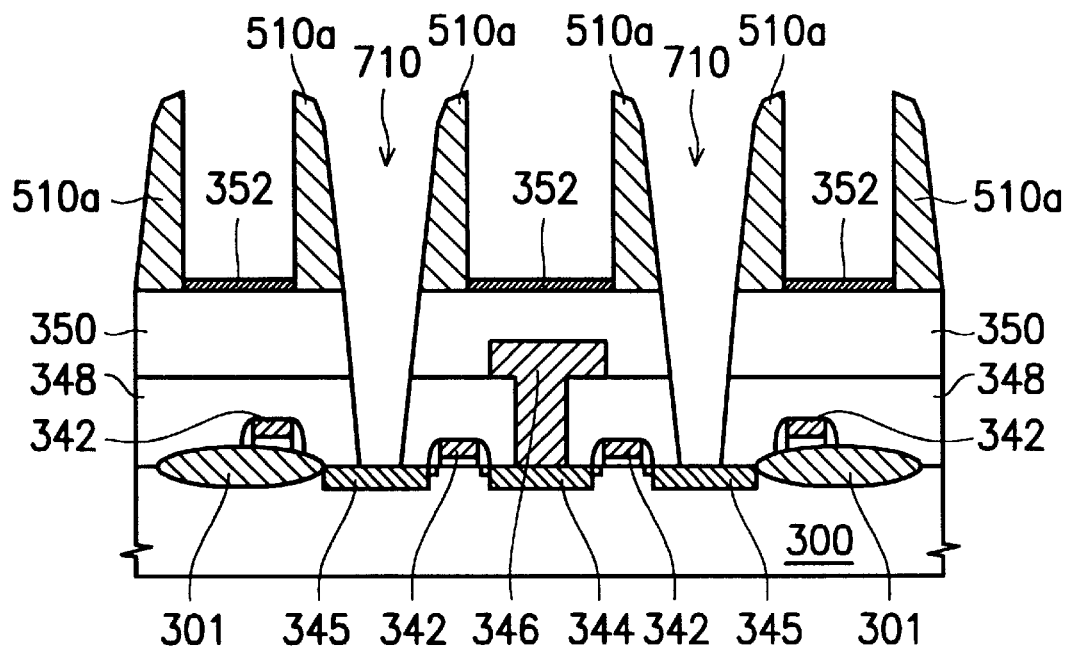

Referring to FIG. 7, by using the buffering layer 352 and the conducting spacers 510a as masking, the insulating layer 354 covering the buffering layer 352 is removed. Simultaneously, portions of the insulating layer 350 not covered by the buffering layer 352 and the conducting spacers 510a area also etched away to form contact windows 710. Therefore, portions of the diffused regions 345 are exposed via the contact windows 710. Preferably, the etching process can be implemented by reactive ion etch processes using CHF$_3$ as the reactant.

Figure 8:
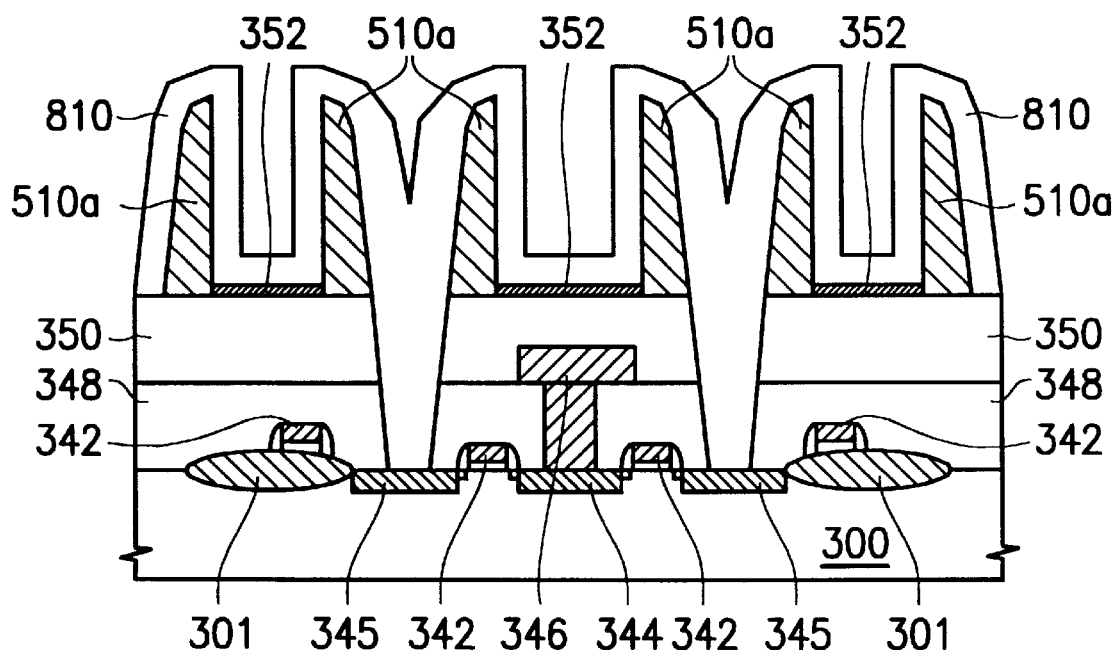

Referring to FIG. 8, a conducting layer 810 is conformably deposited on the overall surface over the substrate 300, including the buffering layer 352, the conducting spacers 510a, and the contact windows 710. Preferably, the conducting layer 810 is a polysilicon layer having a thickness of about 500–2000 Å formed by means of low-pressure chemical vapor deposition through the pyrolysis of SiH$_4$. To increase the conductivity thereof, the polysilicon layer can be doped with diffusion, ion implantation, or in-situ doped methods. Preferably, the doping impurities are either arsenic-containing ions or phosphorus-containing ions.

Figure 9:
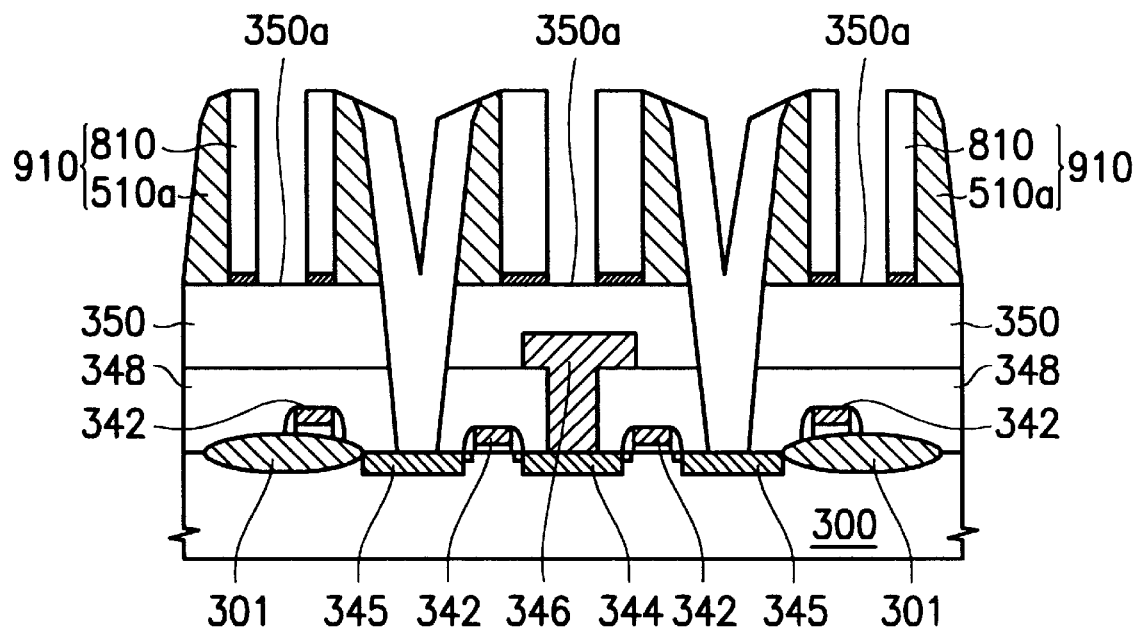

Referring to FIG. 9, the conducting layer 810 is etched back to a desired thickness in order to expose portions of the buffering layer 352. Subsequently, the exposed buffering layer 352 is etched away to expose portions 350a of the insulating layer 350. Accordingly, the remained conducting layer 810 as well as the polysilicon spacers 510a are electrically connected together to constitute the bottom plates 910 of the capacitor.

Figure 10:
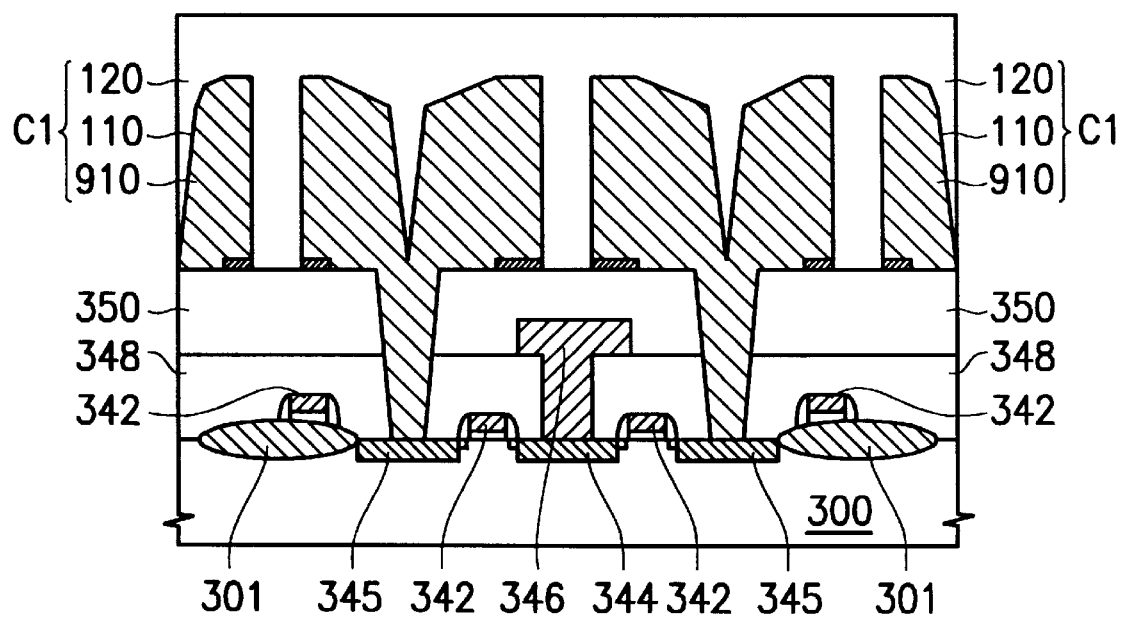
Figure 11:
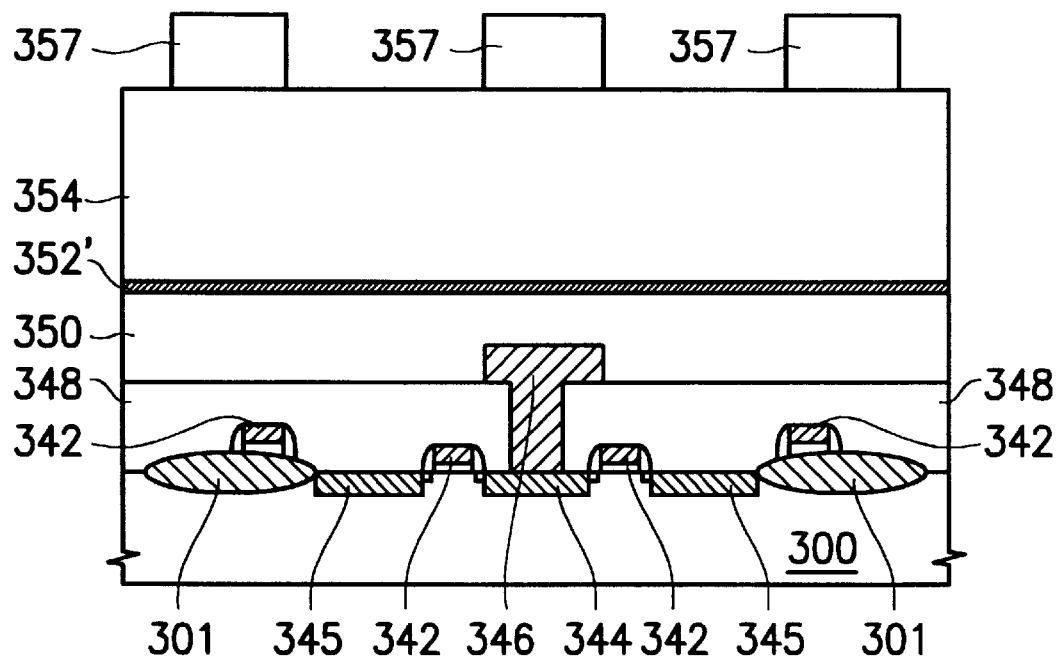
FIGS. 11–14 schematically depict in cross-sectional views procedural steps involved in fabricating a capacitor plate according to another embodiment of the present invention.

Referring to FIG. 10, a dielectric layer 110, such as oxide/nitride/oxide (ONO) or Ta$_2$O$_5$ of high dielectric constant, are conformably deposited along the surface of the bottom plates 910. The dielectric layer 110 has a thickness of about 30–100 Å. Next, a conducting layer 120 is deposited on the dielectric layer acting as the top plates of the capacitors. Preferably, the conducting layer 120 can be a polysilicon layer formed by means of low-pressure chemical vapor deposition processes through the pyrolysis of SiH$_4$, having a thickness of about 1000–3000 Å. The conducting layer 120 can be doped by diffusion, ion implantation, or in-situ doped methods with impurities. The doped impurities are either arsenic-containing ions or phosphorus-containing ions. Accordingly, the bottom plate 910, the dielectric layer 110 and the top plate 120 make up capacitor Cl.

Moreover, referring to FIGS. 11–14, the procedural steps involved in fabricating capacitors in accordance with another embodiment of the present invention are schematically shown in cross-sectional views. FIGS. 11–14 correspond to FIGS. 3–6, respectively. Otherwise, those steps depicted in FIGS. 7–10 are the same. Therefore the description of FIGS. 7–10 will not be repeated in order to avoid redundance.

Referring to FIG. 10, an insulating layer 350 is deposited over the substrate 300 and then planarized by means of thermal reflow processes. The insulating layer 350 might be made of silicon dioxide deposited by means of thermal oxidation, or low-pressure chemical vapor deposition (LPCVD) processes by decomposing tetraethyl orthosilicate (TEOS). In addition, the insulating layer 350 can be a borophosphosilicate glass (BPSG) layer, which is deposited by means of atmospheric-pressure chemical vapor deposition processes by the reaction of tetraethyl orthosilicate and O$_3$/O$_2$, with the addition of tri-ethyl-borate (TEB) and tri-methyl-phosphate (TMP). Preferably, the inter-insulating layer 348 has a thickness of about 500–2000 Å, and the insulating layer 350 has a thickness of about 1500–4000 Å.

Sequentially, a buffering layer 352', an insulating layer 354, both of which constitute a stacked structure, are formed on the insulating layer 350. Preferably, the buffering layer 352' is a polysilicon layer formed through means of low-pressure chemical vapor deposition processes by the pyrolysis of SiH$_4$ to serve as an etching protection layer for subsequent etching processes. Preferably, the buffering layer 352' has a thickness of about 200–1000 Å. The insulating layer 354 is made of silicon oxide formed by means of low-pressure chemical vapor deposition processes, having a thickness of about 5000–15000 Å, preferably. A photoresist layer 357 is coated over the insulating layer 354 and patterned by means of photolithography.

Figure 12:
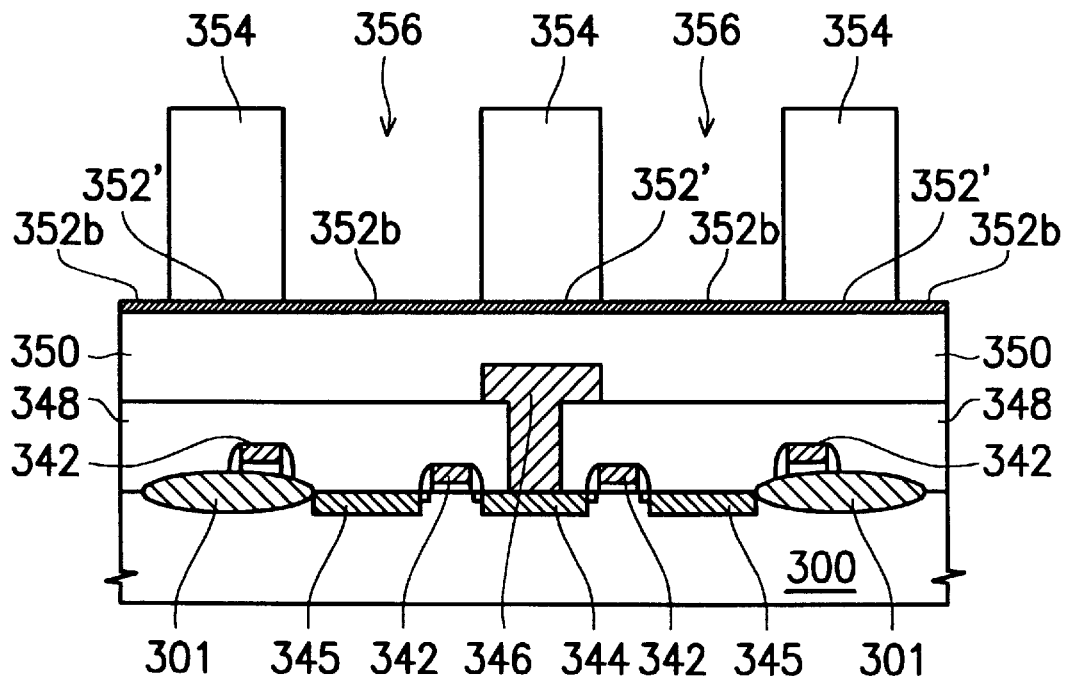

Referring to FIG. 12, by using the patterned photoresist layer 357 as masking, anisotropic etching the stacked structure forms openings 356. Preferably, the etching process is implemented by means of reactive ion etching process making use of CHF$_3$ as reactant to sequentially etch the insulating layer and thereby expose portions 352b of the buffering layer 352'.

Figure 13:
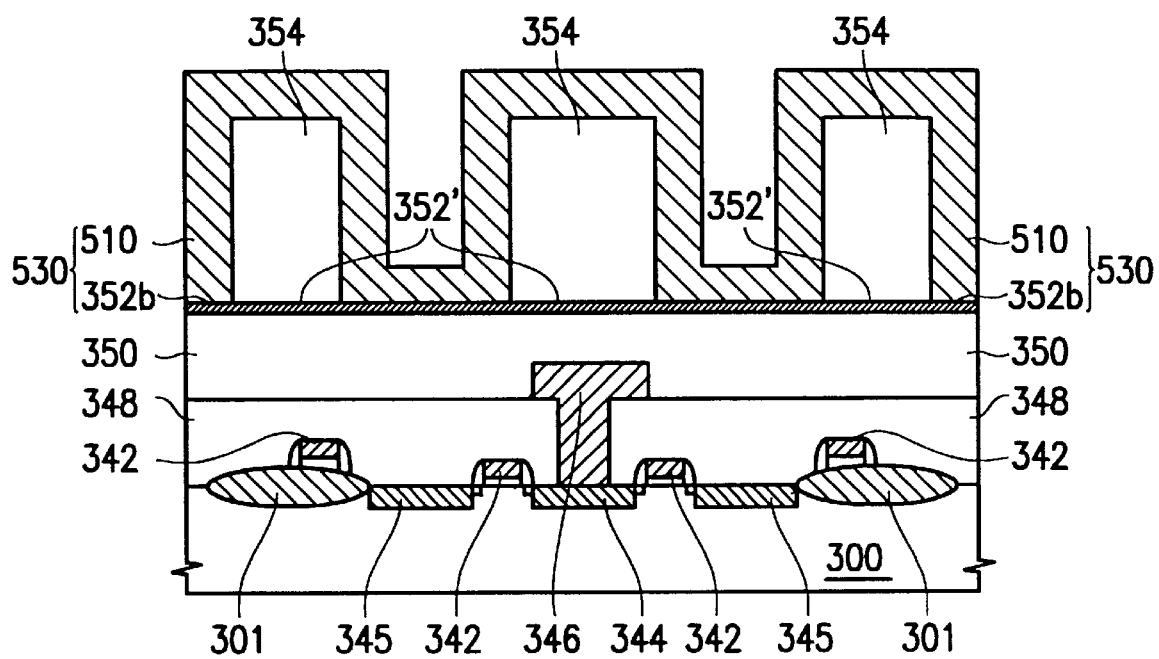

As shown in FIG. 13, a conducting layer 510 is formed over the substrate 300. Preferably, the conducting layer 510 is a polysilicon layer formed by means of a low-pressure chemical vapor deposition process through the pyrolysis of SiH$_4$, having a thickness of about 500–2000 Å so as to conformably overlie the entire surface of the stacked structure and the exposed buffering layer 352b. The conducting layer 510 and the exposed buffering layer 352b are combined to constitute another conducting layer 530. To increase the conductivity thereof, the polysilicon layer can be doped by diffusion, ion implantation, or in-situ doped methods with impurities. Preferably, the doping impurities are either arsenic-containing ions or phosphorus-containing ions.

Figure 14:
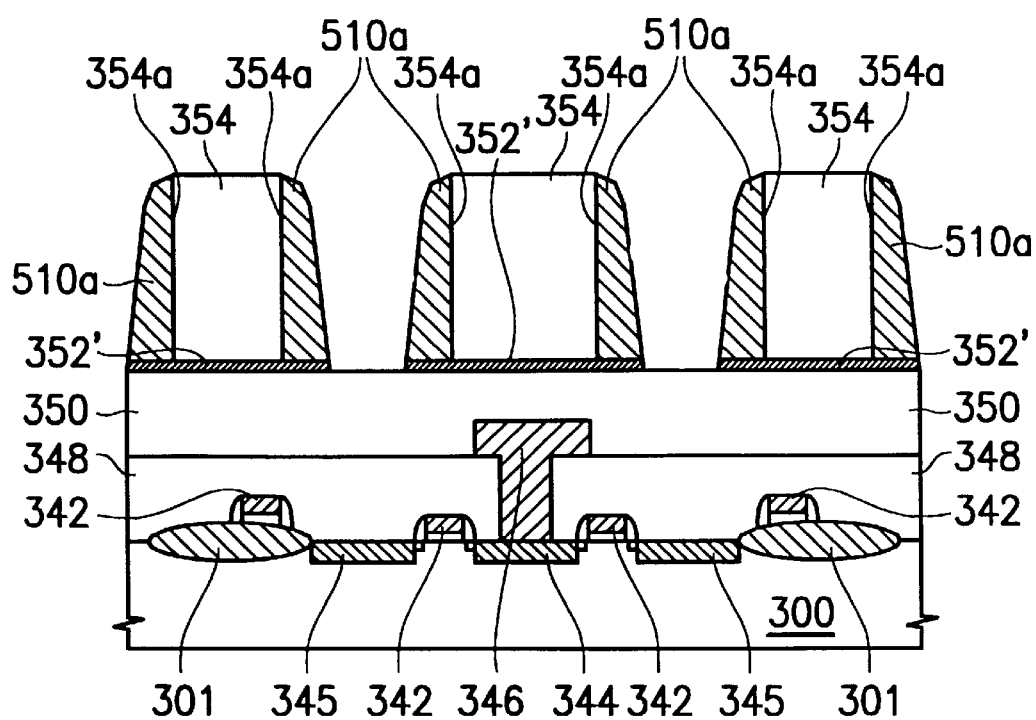

As depicted in FIG. 14, etching back the conducting layer 530 leaves conducting spacers 510a on the sidewalls 354a of the openings 356. Preferably, reactive ion etch processes are implemented to etch back the conducting layer by using Cl$_2$, HCl, and SiCl$_2$ as reacting gases if the conducting layer 530 is made of doped polysilicon.

Consequently, those capacitors fabricated in accordance with the present invention can be applied to DRAM-cells constituted by the aforementioned transistors, word lines, bit lines.

In conclusion, the method of fabricating stacked capacitors in accordance with the present invention has several features as follows:

(1) Such a capacitor structure is not constrained by the critical dimensions of photolithography processes;

(2) The method streamlines manufacturing processes by decreasing the number of masks by one; and (3) By effectively making use of available area, the fabricated capacitors in accordance with the present invention conform to the requirements of the next generation of DRAM.

Accordingly, the capacitor structure and its fabrication method increases the cell storage capacity under the constraint of available area.

The foregoing description of preferred embodiments of the present invention has been provided for the purposes of illustration and description. It is not intended to be exhaustive or to limit the invention to the precise forms disclosed. Many modifications and variations will be apparent and practitioners skilled in the art. The embodiments were chosen and described to best explain the principles of the invention and its practical application, thereby enabling others skilled in the art to understand the invention to practice various other embodiments and make various modifications suited to the particular use contemplated. It is intended that the scope of the invention can be defined by the following claims or their equivalents.

What is claimed is:

1. A method of fabricating a capacitor plate, comprising the following steps of:

providing a substrate;

forming a first insulating layer over said substrate;

sequentially forming a buffering layer made of silicon nitride and a second insulating layer, both of which constitute a stacked structure, over said first insulating layer;

patterning said stacked structure to form an opening thereby-exposing a portion of said first insulating layer therethrough;

forming conducting spacers adjacent to the sidewalls of said opening;

removing said second insulating layer, and simultaneously removing a portion of said first insulating layer not covered by said buffering layer as well as said conducting spacers to form a contact window thereby exposing a portion of said substrate therethrough;

conformably forming a conducting layer over said substrate;

etching said conducting layer until a portion of said buffering layer is exposed; and removing said exposed buffering layer.

2. The method as claimed in claim 1, wherein said substrate is a P-type silicon substrate.

3. The method as claimed in claim 1, wherein said insulating layers are made of silicon dioxide.

4. The method as claimed in claim 3, wherein said silicon dioxide is deposited by means of low-pressure chemical vapor deposition processes through the decomposition of tetraethyl orthosilicate.

5. The method as claimed in claim 1, wherein said first insulating layer is made of borophosphosilicate glass.

6. The method as claimed in claim 5, wherein said borophosphosilicate glass is made by means of atmospheric-pressure chemical vapor deposition processes through the reaction of tetraethyl orthosilicate and $O_3/O_2$, with the addition of tri-ethyl-borate and tri-methyl-phosphate.

7. The method as claimed in claim 1, wherein said silicon nitride is made by means of low-pressure chemical vapor deposition processes through reacting $SiH_2Cl_2$ with $NH_3$.

8. The method as claimed in claim 1, wherein the step of patterning said stacked structure comprises:

forming a photoresist pattern via photolithography;

sequentially removing said second insulating layer and said buffering layer by means of anisotropic etching processes to form said opening by using said photoresist pattern as masking; and removing said photoresist pattern.

9. The method as claimed in claim 1, wherein said conducting spacers are made of polysilicon.

10. The method as claimed in claim 9, wherein the step of forming said conducting spacers comprises:

depositing a polysilicon layer conformably covering said substrate by means of low-pressure chemical vapor deposition processes; and etching back said polysilicon layer to form said conducting spacers.

11. The method as claimed in claim 10, wherein said polysilicon layer is deposited by the pyrolysis Of $SiH_4$.

12. The method as claimed in claim 1, wherein the step of forming said contact window is implemented by reactive ion etching.

13. The method as claimed in claim 1, wherein said conducting spacers and said conducting layer are electrically connected together to constitute said capacitor plate.

14. A method of fabricating a capacitor, comprising the following steps of:

providing a substrate having a transistor, constituted by at least one diffused region, formed thereon and overlaid by an inter-insulating layer;

forming a first oxide layer over said substrate;

sequentially forming a nitride layer and a second oxide layer, both of which constitute a stacked structure, overlying said first oxide layer;

patterning said stacked structure to form an opening, which exposes a portion of said first oxide layer;

forming a first polysilicon layer conformably overlying said substrate;

etching said first polysilicon layer to polysilicon spacers adjacent to the sidewalls of said opening;

removing said second oxide layer, simultaneously removing a portion of said first oxide layer not covered by said nitride layer as well as said polysilicon spacers to form a contact window thereby exposing a portion of said diffused region;

conformably forming a second polysilicon layer over said substrate;

etching back said second polysilicon layer until a portion of said nitride layer is exposed;

removing said exposed nitride layer, thereby exposing said polysilicon spacers and said second polysilicon layer serve as a bottom plate;

forming a dielectric layer overlying said bottom plate; and forming a third polysilicon layer overlying said dielectric layer as an upper plate.

15. The method as claimed in claim 14, wherein said diffused region is one source/drain region of said transistor.

16. The method as claimed in claim 15, wherein said transistor further comprises another source/drain region.

17. The method as claimed in claim 16, wherein said another source/drain region is connected to a bit line thereby a semiconductor memory cell is constructed.

* * * * *